(12) United States Patent
Lin et al.

(10) Patent No.: US 6,426,281 B1
(45) Date of Patent: Jul. 30, 2002

(54) METHOD TO FORM BUMP IN BUMPING TECHNOLOGY

(75) Inventors: Kuo-Wei Lin; Cheng-Yu Chu, both of Hsinchu; Yen-Ming Chen, Hsin-Chu; Yang-Tung Fan; Fu-Jier Fan, both of Jubei; Chiou-Shian Peng; Shih-Jang Lin, both of Hsinchu, all of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/759,911

(22) Filed: Jan. 16, 2001

(51) Int. Cl.⁷ .............................................. H01L 21/44
(52) U.S. Cl. ...................... 438/612; 438/613; 438/614
(58) Field of Search .................................. 438/612, 613, 438/614

(56) References Cited

U.S. PATENT DOCUMENTS

| | | | |
|---|---|---|---|
| 5,130,275 A | * 7/1992 | Dion | 437/225 |
| 5,277,756 A | * 1/1994 | Dion | 156/664 |
| 5,290,732 A | * 3/1994 | Kumar et al. | 437/183 |
| 5,468,655 A | 11/1995 | Greer | 437/8 |
| 5,587,342 A | 12/1996 | Lin et al. | 437/209 |
| 5,607,099 A | 3/1997 | Yeh et al. | 228/180.22 |
| 5,863,812 A | 1/1999 | Manteghi | 438/108 |
| 5,933,752 A | 8/1999 | Yanagida | 438/613 |
| 5,943,597 A | * 8/1999 | Kleffner et al. | 438/613 |
| 5,946,590 A | 8/1999 | Satoh | 438/613 |
| 6,057,168 A | 5/2000 | Seyama et al. | 436/616 |
| 6,165,885 A | * 12/2000 | Gaynes et al. | 438/612 |
| 6,251,501 B1 | * 6/2001 | Higdon et al. | 438/612 |
| 6,251,797 B1 | * 6/2001 | Nishimura | 438/613 |
| 6,281,106 B1 | * 8/2001 | Higdon et al. | 438/613 |
| 2001/0033020 A1 | * 10/2001 | Stierman et al. | 257/737 |

* cited by examiner

Primary Examiner—John F. Niebling
Assistant Examiner—Lynne A. Gurley
(74) Attorney, Agent, or Firm—George O. Saile; Stephen B. Ackerman

(57) ABSTRACT

A new method and processing sequence is provided for the creation of interconnect bumps. A layer of passivation is deposited over a contact pad and patterned, creating an opening in the layer of passivation that aligns with the contact pad. A layer of UBM metal is deposited over the layer of passivation, the layer of UBM is overlying the contact pad and limited to the immediate surroundings of the contact pad. The central surface of the layer of UBM is selectively electroplated after which a layer of solder or solder alloy is solder printed over the electroplated surface of the layer of UBM. A solder flux or paste is applied over the surface of the solder printed solder compound or solder alloy. Flowing of the solder or solder alloy creates the solder bump of the invention.

17 Claims, 5 Drawing Sheets

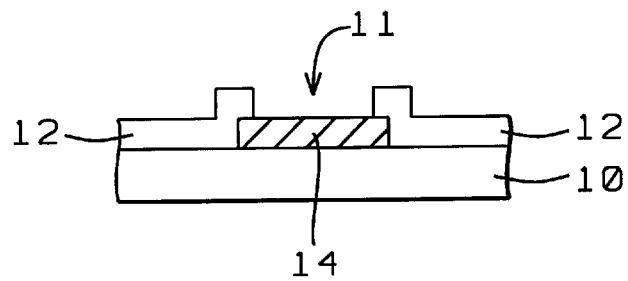
FIG. 1 — Prior Art
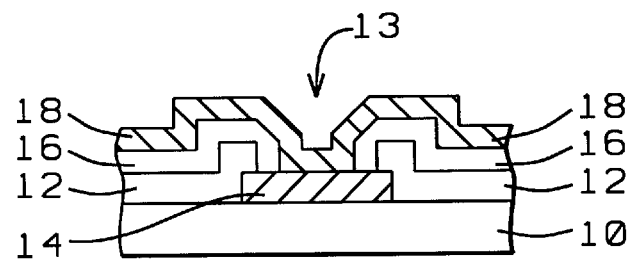
FIG. 2 — Prior Art
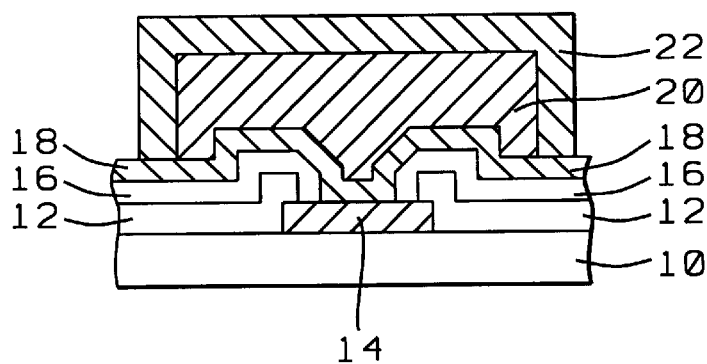
FIG. 3 — Prior Art
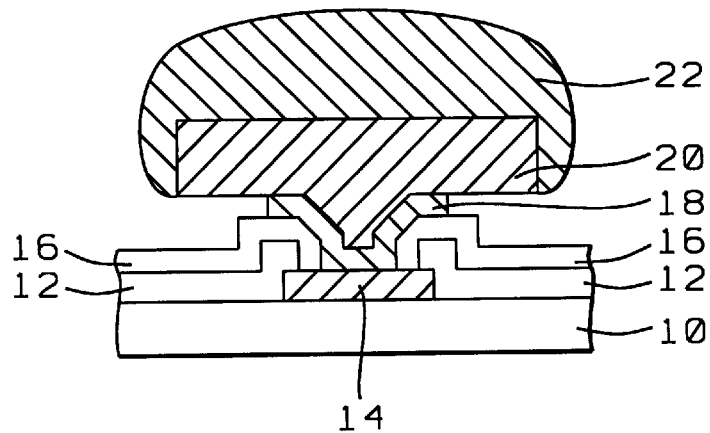
FIG. 4 — Prior Art

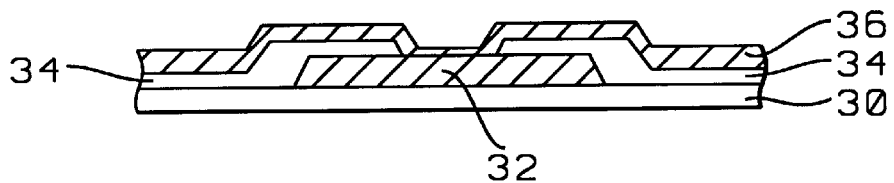
FIG. 5 - Prior Art
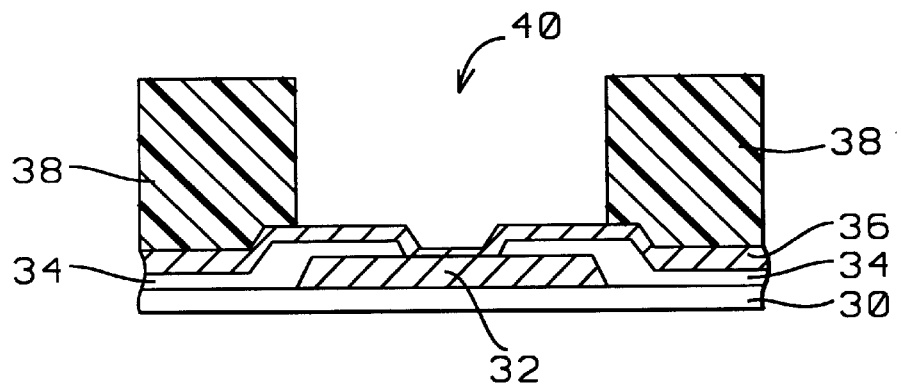
FIG. 6 - Prior Art
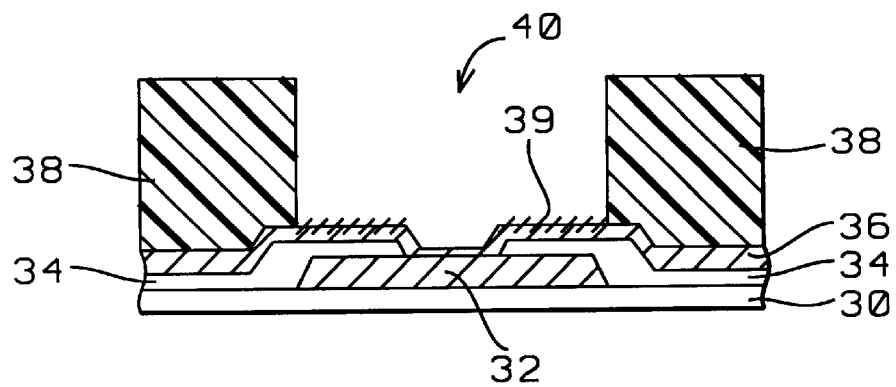
FIG. 7 - Prior Art
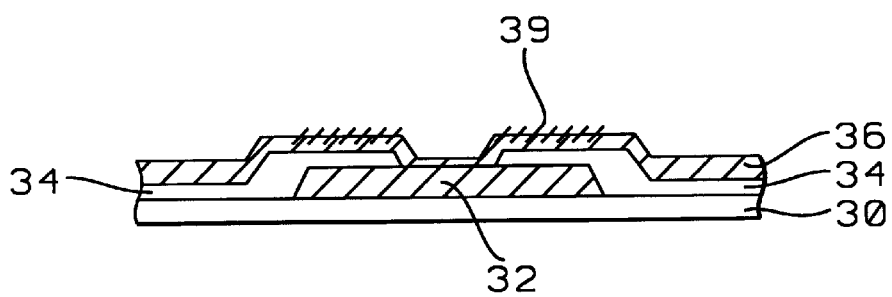
FIG. 8 - Prior Art

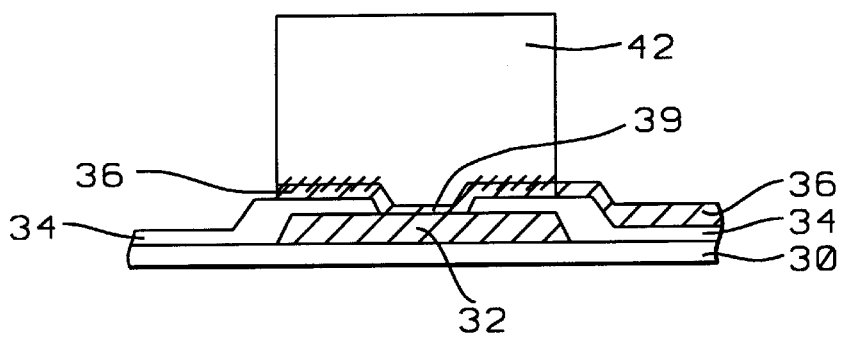
FIG. 9 - Prior Art
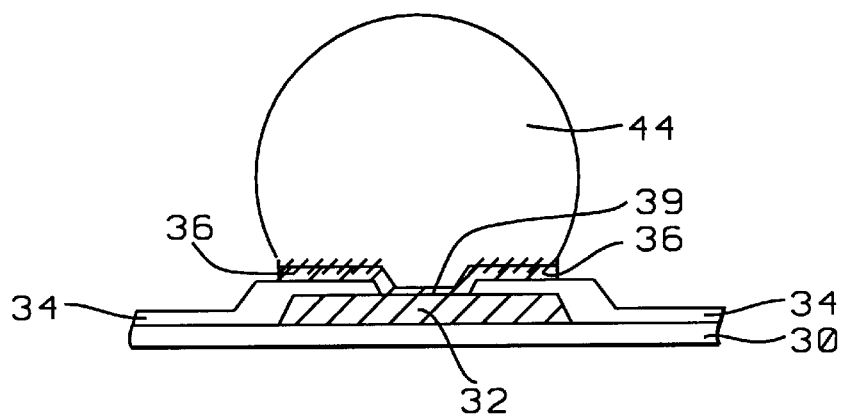
FIG. 10 - Prior Art
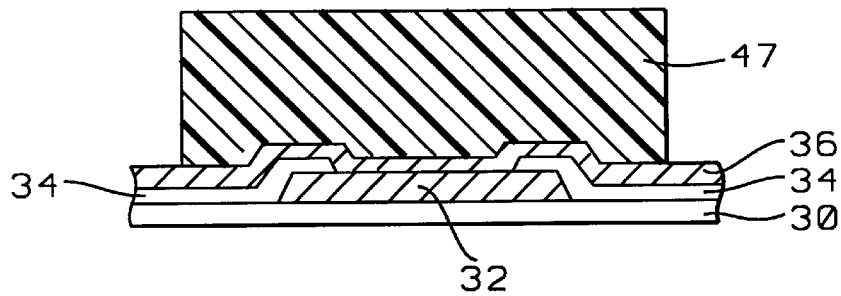
FIG. 11
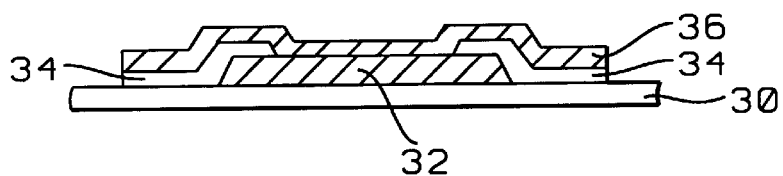
FIG. 12

METHOD TO FORM BUMP IN BUMPING TECHNOLOGY

BACKGROUND OF THE INVENTION (1) Field of the Invention

The invention relates to the fabrication of integrated circuit devices, and more particularly, to a method of forming solder bumps whereby plating is used to create Under Ball Metallurgy and printing is used for creating the solder ball.

(2) Description of the Prior Art

The present invention addresses a method of forming an electrical interconnection and, more particularly, a method of forming an interconnect bump. The method of the present invention can be used for the creation of electrical contacts on the surface of semiconductor devices but is not limited to such applications. The method of the present invention can equally be applied to form raised electrical contacts on semiconductor substrates, printed circuit boards, flex circuits or a metallized or glass substrate or semiconductor device mounting support. In its present form the method of the invention is most favorably applied to the creation of elevated points of electrical contact on the surface of semiconductor devices since this is the application where small size contact points with a diameter of 50 microns or less are of most benefit.

Past methods of forming electrical interconnects by forming elevated regions on a semiconductor surface used methods of electroplating or methods of screen-printing.

For the method of screen printing, where it is the objective to form elevated points of electrical contact on a semiconductor surface, a dry photoresist mask (referred to as a solder mask) is laminated over the semiconductor surface and patterned. The dry photoresist mask is left in place on the semiconductor surface where no elevated points of electrical contact are to be created, exposing the points of electrical contact over which the elevated points of electrical contact are to be created. A screen is used through which solder paste or flux is deposited onto the semiconductor surface where the elevated contact points are to be created, after which the bumps can be formed for electrical interconnect. The method of screen-printing is most typically used to create points of electrical contact (bumps) that have a diameter in excess of 100 microns. For device dimensions where smaller diameter bumps are required, another method must be provided that allows for the creation of smaller diameter bumps. For the dry resist method, the minimum thickness of the layer of dry photoresist is in the range of 75 to 100 microns, making it difficult to obtain openings of small diameter in the (relatively) thick layer of dry photoresist. For the application of the dry resist in the creation of bumps on the surface of a circuit board, the dry resist method has, up to this point, served its purpose. Where however smaller geometries are used, such as on the surface of a semiconductor device, the dry resist method does not provide for an interconnect bump with a small enough diameter. In addition, dry resist layers are difficult to apply and adhere to the surface of semiconductor substrates. The method of dry resist lamination can be further extended to create metal layers on the exposed portions of the underlying semiconductor surface by methods of electroplating. This too however runs into problems where small geometries are required for the to be created elevated point of electrical contact.

Other methods have been used to create the required pattern to form interconnect bumps. These methods have as objective to create, at the point where the interconnect bump has to be created, a surface that lends itself to this creation such as a surface containing a solderable material or a conductive polymer of a solder flux. A metal mask is for this purpose frequently used to shield areas, where no interconnect bumps are to be created, from the deposition of such materials. The metal mask presents problems of size limitations because the openings that can be created in the surface of the metal mask cannot be created small enough such that small enough diameter interconnect bumps can be created. In addition, masking techniques invariably present problems of alignment, these problems are further aggravated where very small geometries are required or where a dense pattern of interconnect bumps is to be created.

FIG. 1 shows an example of one of the methods that is used to create an interconnect bump. A semiconductor surface 10 has been provided with a metal contact pad 14, the semiconductor surface 10 is protected with a layer 12 of passivation. An opening 11 has been created in the layer 12 of passivation, the surface of the metal contact pad 12 is exposed through this opening 11. Next, FIG. 2, a dielectric layer 16 is deposited over the surface of the layer 12 of passivation, the layer 16 of dielectric is patterned and etched creating an opening 13 in the layer 16 of dielectric that aligns with the metal pad 14 and that partially exposes the surface of the metal pad 14. A layer 18 of metal, typically UBM, is created over the layer 16 of dielectric, layer 18 of metal is in contact with the surface of the metal pad 14 inside opening 13. The region of layer 18 of metal that is geometrically above the metal pad 14 will, at a later point in the processing, form a pedestal over which the interconnect bump will be formed. This pedestal can be further extended in a vertical direction by the deposition and patterning of one or more additional layers that may contain a photoresist or a dielectric material, these additional layers are not shown in FIG. 1. These layers essentially have the shape of layer 16 and are removed as one of the final processing steps that is applied for the formation of the interconnect bump.

A layer 20 of metal such as copper, FIG. 3, that forms an integral part of the to be created interconnect bump, is next electroplated on the surface of the layer 18 of metal, whereby the layer 18 serves as the lower electrode during the plating process. The final layer 22 of solder is electroplated on the surface of layer 20.

The layer 18 of metal is next etched, FIG. 4, leaving in place only the pedestal for the interconnect bump. During this etch process the deposited layers 20 and 22 serve as a mask. If, as indicated above, additional layers of dielectric or photoresist have been deposited for the further shaping of pedestal 18 in FIG. 4, these layers are also removed at this time.

A solder paste or flux is now applied to the layer 22 of solder, the solder 22 is melted in a reflow surface typically under a nitrogen atmosphere, creating the spherically shaped interconnect bump 22 that is shown in FIG. 4.

The above processing steps are in many of the applications of the indicated process augmented by processing steps of curing and pre-baking in order to improve hardness and other desirable performance parameters of the various layers that are used for the processing sequence that has been described in FIGS. 1 through 4. For instance, a layer of photoresist that is used as part of the processing sequence can be pre-baked prior to the exposure and etching of the photoresist layer. These steps have not been included in the above description for reasons of simplicity of description.

In addition to the above indicated additional layers of dielectric or photoresist that can be used to further shape the pedestal of the interconnect bump, many of the applications that are aimed at creating interconnect bumps make use of layers of metal that serve as barrier layers or that have other specific purposes, such as the improvement of adhesion of the various overlying layers or the prevention of diffusion of materials between adjacent layers. These layers collectively form layer 18 of FIG. 2 and have, as is clear from the above, an effect on the shape of the completed bump and are therefore frequently referred to as Ball Limiting Metal (BLM) layer. Frequently used BLM layers are successive and overlying layers of chrome, copper and gold, whereby the chrome is used to enhance adhesion with an underlying aluminum contact pad, the copper layer serves to prevent diffusion of solder materials into underlying layers while the gold layer serves to prevent oxidation of the surface of the copper layer. The BLM layer is represented by layer 18 of FIGS. 2 through 4.

The following paragraphs will provide further details relating to the technologies of electroplating and evaporation as they apply to the processes of forming interconnect bumps.

The method of electroplating follows the processing steps of (over the surface of a substrate wherein a point of electrical contact, typically containing aluminum, has been provided, all steps of processing being centered around this point of electrical contact) depositing a layer of polyimide and etching an opening in this layer of polyimide that aligns with the point of contact, depositing (by vacuum evaporation) a layer of Under Bump Metallurgy (UBM, also referred to as Ball Limiting Metallurgy or BLM) over the layer of poly including the opening created in the layer of poly. A layer of photoresist is deposited over the layer of UBM and patterned, creating an opening in the layer of photoresist that aligns with that part of the layer of UBM that remains in place under the to be created solder bump. Next a layer of metal (typically copper) is electroplated over the layer of photoresist whereby the layer of UBM serves as the common electrode for the electroplating process, the electroplated metal is in contact with the layer of UBM. A layer of solder is next plated over the layer of electroplated metal. The layer of electroplated metal is centered on the opening that has been created in the layer of photoresist, as is the layer of plated solder. The photoresist is removed using the solder bump as a mask, the layer of UBM is selectively etched and removed where this layer does not underlie the to be created solder bump in order to electrically isolate adjacent solder bumps from each other. The critical step of the process is performed as a final step, whereby a flux is applied to the plated solder and the solder is melted in a reflow furnace under a nitrogen atmosphere, creating a spherically shaped solder bump. The above summarized processing steps of electroplating that are used for the creation of a solder bump are supplemented by the step of curing or pre-baking of the layer of photoresist after this layer has been deposited over the layer of UBM.

The process of evaporation also starts with a semiconductor surface wherein a metal point of contact has been provided. A layer of passivation is deposited and patterned, creating an opening in the layer of passivation that aligns with the metal point of contact. A layer of UBM (this layer may be a composite layer of metal such as chromium followed by copper followed by gold in order to promote (with chromium) improved adhesion and to form a diffusion barrier layer or to prevent oxidation (the gold over the copper)) is formed over the layer of passivation and inside the opening created in the layer of passivation. Solder is next selectively plated over the deposited layer of UBM and melted in a solder reflow surface in a hydrogen ambient for solder reflow, in this manner forming the spherically shaped solder bumps.

U.S. Pat. No. 6,057,168 (Seyama et al.) shows a bump process using print screening.

U.S. Pat. No. 5,946,590 (Satoh) shows (in the prior art section) a plating process for bump.

U.S. Pat. No. 5,863,12 (Manteghi) shows a screening printing process for a solder mask for a bump.

U.S. Pat. No. 5,468,655 (Greer) shows a metal paste used in a bump process.

U.S. Pat. No. 5,587,342 (Lin et al.) shows a conductive paste bump process.

U.S. Pat. No. 5,607,099 (Yeh et al.) and U.S. Pat. No. 5,933,752 (Yanagida) show related processes.

SUMMARY OF THE INVENTION

A principle objective of the invention is to provide a cost reduced method of creating interconnect bumps.

Another objective of the invention is to provide a process for creating interconnect bumps that allows for the creation of very fine pitch interconnect bumps.

Yet another objective of the invention is to provide a process for creating interconnect bumps that eliminates the expense that is incurred using processes of electroplating for the creation of interconnect bumps.

A still further objective of the invention is to provide a process for creating interconnect bumps that eliminates the disadvantage that is incurred when using screen printing techniques of not being able to create very fine pitch interconnect bumps.

A still further objective of the invention is to provide a method for creating interconnect bumps that applies methods of Under Ball Technology and screen printing for the creation of interconnect bumps.

In accordance with the objectives of the invention, a new method and processing sequence is provided for the creation of interconnect bumps. A layer of passivation is deposited over a contact pad and patterned, creating an opening in the layer of passivation that aligns with the contact pad. A layer of UBM metal is deposited over the layer of passivation, the layer of UBM is overlying the contact pad and limited to the immediate surroundings of the contact pad. The central surface of the layer of UBM is selectively electroplated after which a layer of solder or solder alloy is solder printed over the electroplated surface of the layer of UBM. A solder flux or paste is applied over the surface of the solder printed solder compound or solder alloy. Flowing of the solder or solder alloy creates the solder bump of the invention.

BRIEF DESCRIPTION OF THE DRAWINGS

FIGS. 1 through 4 show a cross section of a prior art processing sequence to form interconnect bumps, as follows:

FIG. 1 shows a cross section of a semiconductor surface on the surface of which a contact pad has been created, the semiconductor surface is covered with a patterned layer of passivation.

FIG. 2 shows the cross section of FIG. 1 after a patterned layer of dielectric and a layer of metal have been created on the semiconductor surface.

FIG. 3 shows a cross section of FIG. 2 after a layer of interconnect metal and a layer of solder compound have been deposited.

FIG. 4 show a cross section after excess layers have been removed from the semiconductor surface and after the solder has been flowed forming the interconnect bump.

FIGS. 5 through 10 show a conventional processing sequence of creating a solder bump, as follows:

FIG. 5 shows a cross section of a semiconductor surface on which a contact pad has been provided, a layer of passivation has been deposited over the semiconductor surface and has been patterned and etched, partially exposing the surface of the aluminum pad. In-situ sputter clean has been performed of the exposed surface of the contact pad. A seed layer (not shown in FIG. 5) has been blanket deposited over the surface of the layer of passivation, including the exposed surface of the contact pad, a film of Under Ball Metallurgy has been blanket deposited over the seed layer.

FIG. 6 shows the cross section of FIG. 5 after a layer of photoresist has been deposited over the semiconductor surface and has been patterned and etched, exposing the surface of the layer of UBM overlying the contact pad where the interconnect bump is to be formed.

FIG. 7 shows the cross section of FIG. 6 after the exposed surface of UBM has been electro plated.

FIG. 8 shows the cross section of FIG. 6 after the patterned layer of photoresist has been stripped from the semiconductor surface.

FIG. 9 shows a cross section after a solder alloy has been plated over the surface of the UBM layer.

FIG. 10 shows a cross section after the reflow of the solder alloy has been performed, forming an interconnect bump.

FIGS. 11 through 17 show processing steps of the invention, as follows:

FIG. 11 shows a cross section of a surface with a contact pad over which a layer of passivation has been deposited, patterned and etched, a layer of UBM has been deposited over the etched layer of passivation, a first layer of photoresist has been deposited and patterned and etched in preparation for the etching of the layer of UBM.

FIG. 12 shows a cross section after the layers of UBM and passivation have been etched and the first layer of photoresist has been removed.

FIG. 13 shows a cross section after a second layer of photoresist has been deposited and patterned, creating an opening in the deposited layer of photoresist that aligns with the contact pad.

FIG. 14 shows a cross section after a layer of copper and a layer of nickel have been deposited on the bottom of the opening that has been created in the second layer of photoresist.

FIG. 15 shows a cross section after the opening in the second layer of photoresist has been filled with a solder compound.

FIG. 16 shows a cross section after the patterned second layer of photoresist has been removed.

FIG. 17 shows a cross section after the deposited solder compound has been flowed, creating a solder bump overlying the contact pad.

DESCRIPTION OF THE PREFERRED EMBODIMENTS

Figure 13:
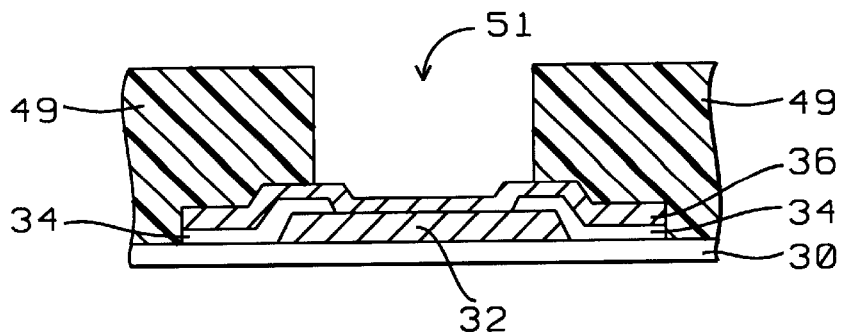

Referring now specifically to FIG. 5, there is shown a cross section of a semiconductor surface 30 on which:

a contact pad 32 has been provided a layer 34 of passivation has been deposited over the semiconductor surface 30 and has been patterned and etched partially exposing the surface of the aluminum pad 32 in-situ sputter clean has been performed of the exposed surface of the contact pad (not shown in FIG. 5)

a seed layer (not shown in FIG. 5) has been blanket deposited over the surface of the layer 34 of passivation including the exposed surface of the contact pad 32, and a film 36 of Under Ball Metallurgy has been blanket deposited over the seed layer.

Layer 30 is the surface of a semiconductor layer, a contact pad 32 has been created on surface 30. Surface 30 will typically be the surface of a semiconductor substrate, the surface of an interconnect substrate and the like. A contact pad 32 has been created on surface 30, electrical contact must be established with contact pad 32 by means of an overlying solder bump. Contact pad 32 serves as interface between the solder bump and electrical interconnects that are provided in the surface of layer 30.

A layer 34. of passivation that may, for instance, contain Plasma Enhanced silicon nitride (PE $Si_3N_4$), is deposited over the surface of layer 30 and of contact pad 32.

Insulating/passivation layers such as silicon oxide and oxygen-containing polymers are deposited over the surface of various layers of conducting lines in a semiconductor device or substrate to separate the conductive interconnect lines from each other, the insulating layers can be deposited using Chemical Vapor Deposition (CVD) techniques. The insulating layers are deposited over patterned layers of interconnecting lines where electrical contact between successive layers of interconnecting lines is established with metal vias created for this purpose in the insulating layers. Electrical contact to the chip is typically established by means of bonding pads or contact pads that form electrical interfaces with patterned levels of interconnecting metal lines. Signal lines and power/ground lines can be connected to the bonding pads or contact pads. After the bonding pads or contact pads have been created on the surfaces of the chip package, the bonding pads or contact pads are passivated and electrically insulated by the deposition of a passivation layer over the surface of the bonding pads. A passivation layer can contain silicon oxide/silicon nitride ($SiO_2/Si_3N_4$) deposited by CVD. The passivation layer is patterned and etched to create openings in the passivation layer for the bonding pads or contact pads after which a second and relatively thick passivation layer can be deposited for further insulation and protection of the surface of the chips from moisture and other contaminants and from mechanical damage during assembling of the chips.

Various materials have found application in the creation of passivation layers. Passivation layer can contain silicon oxide/silicon nitride ($SiO_2/Si_3N_4$) deposited by CVD, a passivation layer can be a layer of photosensitive polyimide or can comprise titanium nitride. Another material often used for a passivation layer is phosphorous doped silicon dioxide that is typically deposited over a final layer of aluminum interconnect using a Low Temperature CVD process. In recent years, photosensitive polyimide has frequently been used for the creation of passivation layers. Conventional polyimides have a number of attractive characteristics for their application in a semiconductor device structure, which have been highlighted above. Photosensitive polyimides have these same characteristics but can, in addition, be patterned like a photoresist mask and can, after patterning and etching, remain on the surface on which it has been deposited to serve as a passivation layer. Typically and to improve surface adhesion and tension reduction, a precursor layer is first deposited by, for example, conventional photoresist spin coating. The precursor is, after a low temperature pre-bake, exposed using, for example, a step and repeat projection aligner and Ultra Violet (UV) light as a light source. The portions of the precursor that have been exposed in this manner are cross-linked, thereby leaving unexposed regions (that are not cross-linked) over the bonding pads. During subsequent development, the unexposed polyimide precursor layer (over the bonding pads) is dissolved, thereby providing openings over the bonding pads. A final step of thermal curing leaves a permanent high quality passivation layer of polyimide over the substrate.

The preferred material of the invention for the deposition of layer 34 of passivation is Plasma Enhanced silicon nitride (PE $Si_3N_4$), deposited using PECVD technology at a temperature between about 350 and 450 degrees C. with a pressure of between about 2.0 and 2.8 Torr for the duration between about 8 and 12 seconds. Layer 34 of PE $Si_3N_4$ can be deposited to a thickness between about 200 and 800 Angstrom.

Layer 34 of PE $Si_3N_4$ is next patterned and etched to create an opening in the layer 34 that overlays and aligns with the underlying contact pad 32.

The etching of layer 34 can use $Ar/CF_4$ as an etchant at a temperature of between about 120 and 160 degrees C. and a pressure of between about 0.30 and 0.40 Torr for a time of between about 33 and 39 seconds using a dry etch process.

The etching of layer 34 can also use $He/NF_3$ as an etchant at a temperature of between about 80 and 100 degrees C. and a pressure of between about 1.20 and 1.30 Torr for a time of between about 20 and 30 seconds using a dry etch process.

For the in-situ sputter clean, a sputter ion milling tool can be used using Ar mixed with $H_2$ as a cleaning agent (sputter source).

For the seed layer that is blanket deposited over the surface of the layer 34 of passivation, including the exposed surface of the contact pad 32, any of the conventional metallic seed materials can be used. The metallic seed layer can be deposited using a sputter chamber or an Ion Metal Plasma (IMP) chamber at a temperature of between about 0 and 300 degrees C. and a pressure of between about 1 and 100 mTorr, using (for instance) copper or a copper alloy as the source (as highlighted above) at a flow rate of between about 10 and 400 sccm and using argon as an ambient gas.

Layer 36 of UBM has been deposited by vacuum evaporation, this layer is as yet to be patterned and etched. Layer 36 may, as previously indicated, contain multiple layers of metal such as the previously cited layers of chrome, followed by a layer of copper, followed by a layer of gold.

FIG. 6 shows the cross section of the semiconductor surface 30 after a layer 38 of photoresist has been deposited over the layer 36 of UBM and has been patterned and etched, creating opening 40 in the layer 38 of photoresist, partially exposing the surface of the layer 36 of UBM overlying the contact pad 32 where the interconnect bump is to be formed.

Layer 38 of photoresist can be deposited to a thickness of between about 2000 and 8000 Angstrom. The methods used for the deposition and development of the layer 38 of photoresist apply conventional methods of photolithography. Photolithography is a common approach wherein patterned layers are usually formed by spinning on a layer of photoresist, projecting light through a photomask with the desired pattern onto the photoresist to expose the photoresist to the pattern, developing the photoresist, washing off the undeveloped photoresist, and plasma etching to clean out the areas where the photoresist has been washed away. The exposed resist may be rendered insoluble (positive-working) and form the pattern, or insoluble (negative working) and be washed away.

The layer 38 of photoresist will, after patterning and etching, remain in place in an area above the aluminum pad 32 that surrounds the pad 32 and that is adjacent to the pad 32. The deposited layer 38 of photoresist can, prior to patterning and etching, be cured or pre-baked further hardening the surface of the layer of photoresist.

Layer 38 of photoresist can be etched by applying $O_2$ plasma and then wet stripping by using $H_2SO_4$, $H_2O_2$ and $NH_4OH$ solution. Sulfuric acid ($H_2SO_4$) and mixtures of $H_2SO_4$ with other oxidizing agents such as hydrogen peroxide ($H_2O_2$) are widely used in stripping photoresist after the photoresist has been stripped by other means. Wafers to be stripped can be immersed in the mixture at a temperature between about 100 degrees C. and about 150 degrees C. for 5 to 10 minutes and then subjected to a thorough cleaning with deionized water and dried by dry nitrogen. Inorganic resist strippers, such as the sulfuric acid mixtures, are very effective in the residual free removal of highly postbaked resist. They are more effective than organic strippers and the longer the immersion time, the cleaner and more residue free wafer surface can be obtained.

The photoresist layer 38 can also be partially removed using plasma oxygen ashing and careful wet clean. The oxygen plasma ashing is heating the photoresist in a highly oxidized environment, such as an oxygen plasma, thereby converting the photoresist to an easily removed ash. The oxygen plasma ashing can be followed by a native oxide dip for 90 seconds in a 200:1 diluted solution of hydrofluoric acid.

FIG. 7 shows a cross section of the semiconductor surface 30 after the exposed surface of layer 36 of UBM, that is surface of layer 36 of UBM that is exposed inside opening 40, has been electro plated using Cu/Ni as a source creating a layer 39 of electroplated Cu/Ni overlying the layer 36 of UBM, layer 39 is bounded by the etched layer 38 of photoresist. This process of electroplating is a pre-cursor to the processing step of depositing solder alloys over the surface of the layer of UBM. During the process of the electroplating, the layer 36 of UBM serves as the cathode of the plating tool.

FIG. 8 shows the cross section of the semiconductor surface after the patterned layer 38 of photoresist has been stripped from the surface of the layer 36 of UBM. The previously highlighted processing conditions for the removal of photoresist can be equally applied to the stripping of the photoresist that is shown in FIG. 8, these conditions therefore do not need to be further highlighted at this time.

FIG. 9 shows a cross section of the semiconductor surface 30 after a layer 42 that comprises any of the available solder materials or their alloys has been plated to the surface of the electroplated layer 36 of UBM. After this solder layer 42 has been created on the surface of the layer 36 of UBM, the layer 36 of UBM is etched using the created layer 42 of solder as a mask, see FIG. 9. Standard RIE procedures, using $Cl_2$—$BCl_3$ as etchant, can be used to etch the layer 36 of UBM.

As cost advantages of the invention can be cited:
the material cost that is incurred when plating is about 5 to 10 times higher than the material cost that is incurred when printing
the equipment cost of plating is about 2 to 6 times higher than the equipment cost of printing
it can be stated as a general observation that the throughput printing process is considerably higher than the throughput of the plating process. Actual comparisons of differences in throughput are dependent on specific equipment design which may vary from application to application.

A flux is next applied to the solder layer 42 and the solder is melted in a reflow surface under a nitrogen atmosphere, forming the spherically shaped solder bump 44 that is shown in FIG. 10.

The processing conditions that have been detailed up to this point under FIGS. 6 through 10 are partially applied during the processing sequence of the invention and are therefore not repeated in detail under the following description of the processing sequence of the invention. The processing sequence of the invention applies the processing steps that have been highlighted under FIG. 5, all conditions that have previously been highlighted for this figure therefore apply to the processing sequence of the invention. Preceding FIG. 11, it is therefore assumed that the processing steps that lead up to the cross section that is shown in FIG. 5 have been performed as part of the processing sequence of the invention. To summarize, FIG. 11 shows the stage in the processing sequence of the invention where:

a semiconductor surface 30 has been provided, a contact pad 32 is present in the surface of the semiconductor surface a layer 34 of passivation has been deposited over the semiconductor surface 30, including the surface of the contact pad 32, and has been patterned and etched partially exposing the surface of the contact pad 32 in-situ sputter clean has been performed of the exposed surface of the contact pad 32 a Under Ball Metallurgy (UBM) layer 36, comprising a barrier layer of titanium over which a seed layer of copper, has been blanket deposited over the surface of the layer 34 of passivation including the exposed surface of the contact pad 32, and a first layer 47 of photoresist has been deposited over the surface of UBM layer 36, this layer 47 of photoresist is patterned and etched leaving in place a layer 47 of photoresist that aligns with the contact pad 32, protecting the layer of UBM that is overlaying the contact pad 32. This protection allows for the removal of the layers of UBM and passivation where these layers do not overly the contact pad 32.

FIG. 12 shows a cross section of the semiconductor surface 30 after the etching of the layer 36 of UBM and the layer 34 of passivation have been performed. The patterned layer 47 of photoresist is removed from the surface, leaving in place the patterned layer 36 of UBM, the patterned layer 34 of passivation and the contact pad 32 (FIG. 12). The etch of layer 36 of UBM removes the UBM layer from areas over the semiconductor surface 30 that surround the contact pad 32 and from between adjacent contact pads. This etch is required to. prevent electrical shorts between adjacent contact pads.

The following steps of the invention form a layer of base metal, overlying the created layer of UBM, on which the solder bump of the invention is to be formed. For this purpose, a second layer 49 of photoresist, FIG. 13, is deposited over the semiconductor surface 30 including the patterned layers 36 and 34 of UBM and passivation respectively. Opening 51 is created in the layer 49 of photoresist, opening 51 aligns with the contact pad 32, and has a bottom over which the surface of the UBM layer 36 is partially exposed.

Figure 14:
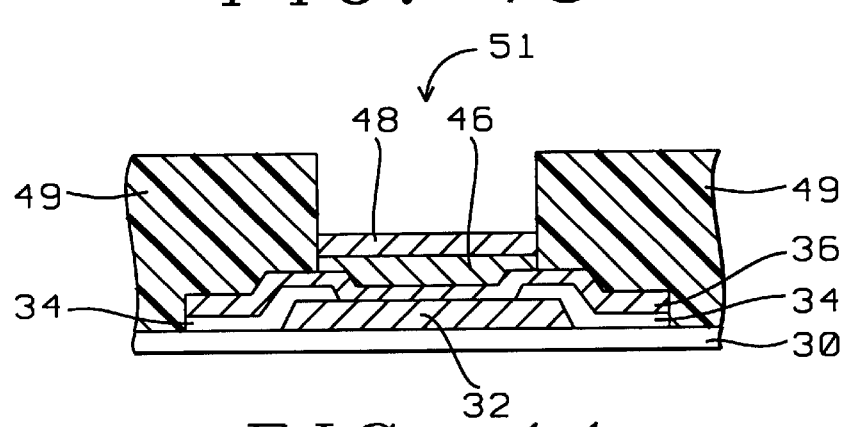
Figure 15:
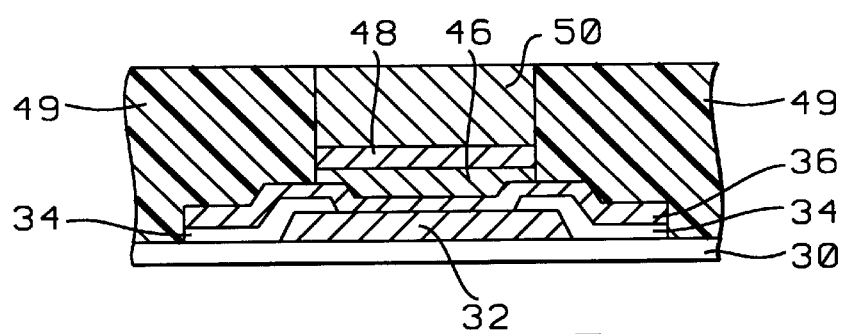

FIG. 14 shows how, after opening 51 has been created in layer 49. of photoresist, layers 46 and 48 of respectively copper and titanium are deposited (plated) over the partially exposed surface of the UBM layer 36 and within the boundaries of opening 51. These layers 46 (Cu) and 48 (Ti) are plated over the bottom of opening 48 using conventional methods of electroplating. The layer 49 of photoresist partially protects the layer 36 of UBM, electroplating of the partially exposed surface of the layer 36 of UBM will therefore take place only over the bottom of opening 51. These layers 46 and 48 form base layers over which, as a next step in the process of the invention, a layer 50, FIG. 15, of solder is created. The process for the creation of this layer 50 of solder uses solder printing techniques.

Figure 16:
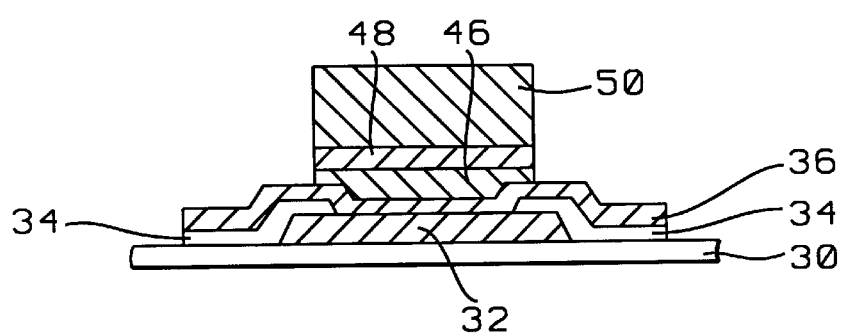
Figure 17:
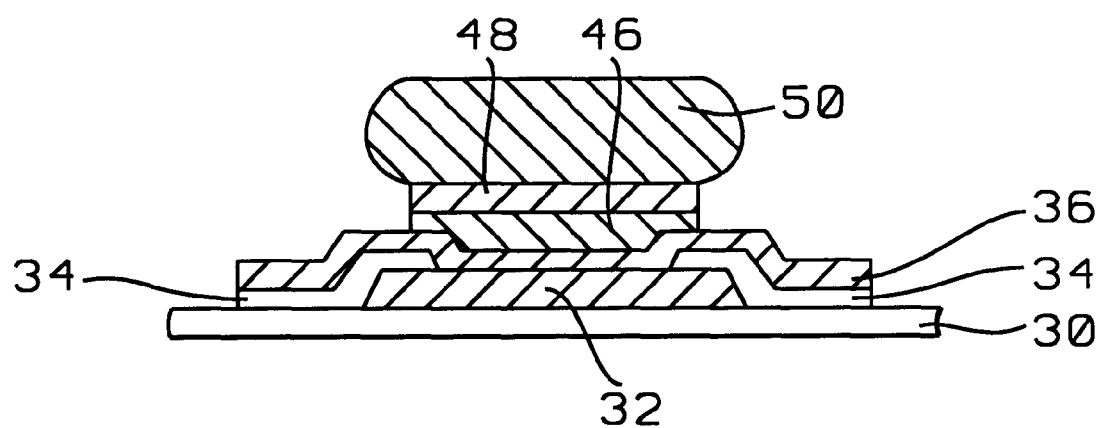

The deposited layer 50 of solder compound is baked, solidifying the deposited solder 50 after which the patterned second layer 49 of photoresist is removed using conventional methods. This leads to the cross section that is shown in FIG. 16. After this cross section has been created, the deposited solder is ready for solder reflow, the results of which are shown in FIG. 17 in cross section.

It is cleat that the process of the invention uses, for the creation of the opening that overlays the contact pad, methods of photolithography and not, as in the convention processing sequence (FIGS. 5 through 10) methods of screen printing. From this, the advantages that can be gained by the process of the invention are immediately clear in that a considerably finer pitch opening (using photolithographic methods) can be obtained and, as a consequence, the making of solder bumps using the processing sequence of the invention, leads itself to being applied for devices with sub-micron device features. Methods of screen-printing do not lend themselves to achieving extreme fine pitch solder bumps, a requirement that becomes ever more urgent with continued micro miniaturization.

Screen-printing uses stencil which is similar to using a metal mask, that is a stainless steel plate in which a large number of openings have been created. Screen-printing can therefore not be applied for the creation of very small pitch solder bumps because the openings that have been provided in the metal mask cannot be very small.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for forming a bump on a semiconductor surface, a contact pad having been provided on said semiconductor surface, comprising:

depositing a layer of passivation over said semiconductor surface including the surface of said contact pad;

patterning and etching said layer of passivation, creating an opening in said layer of passivation having a first diameter, partially exposing the surface of said contact pad over a surface area of said first diameter;

performing an in-situ sputter clean of the exposed surface of the contact pad;

plating a layer of Under Bump Metallurgy (UBM) over the surface of said layer of passivation, including said partially exposed surface of said contact pad, said layer of UBM comprising a barrier layer of titanium over which a seed layer of copper is deposited;

depositing a first layer of photoresist over the semiconductor surface of the layer of UBM;

patterning and etching said first layer of photoresist, leaving in place a layer of first photoresist that is aligned with said contact pad, partially exposing the surface of said layer of UBM;

etching said layer of UBM and said layer of passivation, removing said layer of UBM and said layer of passivation over said semiconductor surface where no layer of first photoresist is present, leaving a layer of remaining UBM and a layer of remaining passivation in place in an area overlying said contact pad;

removing said patterned and etched first layer of photoresist from above the surface of said semiconductor surface;

depositing a second layer of photoresist over the surface of said semiconductor surface, including the surface of said layer of remaining UBM;

patterning and etching said second layer of photoresist, creating an opening in said second layer of photoresist that is aligned with said contact pad, partially exposing the surface of said layer of remaining UBM;

electroplating the partially exposed surface of said layer of remaining UBM with a layer of copper over which a layer of nickel is electroplate, partially filling said opening created in said second layer of photoresist;

filling said opening created in said second layer of photoresist with a solder compound using methods of solder print;

applying a solder flux or paste to the surface of said solder compound;

removing said patterned and etched second layer of photoresist from above said semiconductor surface; and reflowing the surface of said layer of solder or its alloys, forming the solder bump.

2. The method of claim 1 wherein said layer of passivation comprises PE $Si_3N_4$ deposited to a thickness between about 200 and 800 Angstrom.

3. The method of claim 1 wherein said layer of passivation is selected from the group consisting of $SiO_2$, a photosensitive polyimide, phosphorous doped silicon dioxide and titanium nitride, said layer of passivation is deposited to a thickness between about 200 and 800 Angstrom.

4. The method of claim 1 wherein said layer of Under Bump Metallurgy comprises a layer of chromium followed by a layer of copper followed by a layer of gold.

5. The method of claim 1 with an additional step of curing said second layer of photoresist, said additional step to be performed after said second layer of photoresist has been deposited and before said second layer of photoresist is patterned and etched.

6. The method of claim 5 wherein said curing said second layer of photoresist is performed in a $N_2$ gas ambient, at a temperature of between about 300 and 400 degrees C., for a time period between about 1.5 and 2.5 hours, and a pressure of 760 Torr.

7. The method of claim 1 wherein said passivation layer deposited over the surface of said semiconductor surface comprises a plurality of passivation layers.

8. The method of claim 7 wherein at least one of said plurality of passivation layers is selected from the group consisting of PE $Si_3N_4$ and $SiO_2$ and a photosensitive polyimide and phosphorous doped silicon dioxide and titanium nitride.

9. The method of claim 1 wherein said layer of Under Bump Metallurgy comprises a plurality of sub-layers of different metallic composition.

10. The method of claim 1 wherein said contact pad on said semiconductor surface is electrically connected with a semiconductor device with at least one conductive line of interconnect or with at least one conductive contact point.

11. The method of claim 1 wherein said etching said layer of UBM comprises sputter etching or wet etching.

12. The method of claim 1 wherein said semiconductor surface is selected from a group of surfaces comprising semiconductor substrates, printed circuit boards, flex circuits or a metallized or glass substrate or semiconductor device mounting support.

13. A method for forming a bump on a semiconductor surface, a contact pad having been provided on said semiconductor surface, comprising:

depositing one or more layers of passivation over said semiconductor surface including the surface of said contact pad, said one or more layers of passivation comprising PE $Si_3N_4$ deposited to a thickness between about 200 and 2000 Angstrom;

patterning and etching said one or more layers of passivation, creating an opening in said one or more layers of passivation having a first diameter, partially exposing the surface of said contact pad over a surface area of said first diameter;

performing an in-situ sputter clean of the exposed surface of the contact pad;

blanket plating a layer of Under Bump Metallurgy (UBM) over the surface of said layer of passivation, including said partially exposed surface of said contact pad, said layer of UBM comprising one or more layers of different metallic composition, said one or more layers of different metallic composition comprising at least one barrier layer of titanium and at least one seed layer of copper;

depositing a first layer of photoresist over the semiconductor surface of the layer of UBM;

patterning and etching said first layer of photoresist, creating a first layer of photoresist that is aligned with said contact pad, partially overlying and covering the surface of said layer of UBM, said covered surface of said layer of UBM being a surface area of said layer of UBM said needs to be retained in order to form said bump overlying said contact pad;

etching said layer of UBM and said layer of passivation, removing said layer of UBM and said layer of passivation that is not covered by said patterned and etched first layer of photoresist from above the surface of said semiconductor surface, creating a retained layer of UBM overlaying said contact pad;

removing said patterned and etched first layer of photoresist from the surface of said retained layer of UBM;

depositing a second layer of photoresist over the surface of said semiconductor surface, including the surface of said retained layer of UBM;

patterning and etching said second layer of photoresist, creating an opening having a bottom in said second layer of photoresist that aligns with said contact pad, partially exposing the surface of said retained layer of UBM;

electroplating a layer of copper over the bottom of said opening created in said second layer of photoresist followed by plating a layer of nickel over the surface of said plated layer of copper;

solder printing a layer of solder material or its alloy over the electroplated surface of nickel, filling said opening created in said second layer of photoresist;

baking said layer of solder material or its alloy, solidifying said layer of solder material or its alloy;

applying a flux to the surface of the layer of solder or its alloy;

removing said patterned second layer of photoresist from above the surface of said semiconductor surface; and reflowing said layer of solder or its alloys, forming the solder bump.

14. The method of claim 13 with an additional step of curing said second layer of photoresist, said additional step to be performed after said second layer of photoresist has been deposited and before said layer of photoresist is patterned and etched, said curing of said second layer of photoresist being performed in a $N_2$ gas ambient, at a temperature of between about 300 and 400 degrees C., for a time period between about 1.5 and 2.5 hours, and a pressure of 760 Torr.

15. The method of claim 13 wherein at least one of said one or more passivation layers is selected from the group consisting of PE $Si_3N_4$, $SiO_2$, a photosensitive polyimide, phosphorous doped silicon dioxide and titanium nitride.

16. The method of claim 13 wherein said contact pad on said semiconductor surface is electrically connected with a semiconductor device with at least one conductive line of interconnect or with at least one conductive contact point.

17. The method of claim 13 wherein said semiconductor surface is selected from a group of surfaces comprising semiconductor substrates, printed circuit boards, flex circuits or a metallized or glass substrate or semiconductor device mounting support.

* * * * *